(12) United States Patent
Delbaere et al.

(10) Patent No.: US 12,387,893 B2
(45) Date of Patent: Aug. 12, 2025

(54) METHOD FOR DIAGNOSING AN OPERATING STATE OF AN ELECTRICAL SWITCHING DEVICE AND ELECTRICAL SWITCHING DEVICE FOR IMPLEMENTING SUCH A METHOD

(71) Applicant: Schneider Electric Industries SAS, Rueil Malmaison (FR)

(72) Inventors: Stéphane Delbaere, Meylan (FR); Rémy Orban, Saint Martin d'Uriage (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 0 days.

(21) Appl. No.: 17/376,248

(22) Filed: Jul. 15, 2021

(65) Prior Publication Data
US 2022/0020546 A1   Jan. 20, 2022

(30) Foreign Application Priority Data
Jul. 20, 2020 (FR) ...................................... 2007585

(51) Int. Cl.
*H01H 47/00*   (2006.01)
*G01R 31/327*   (2006.01)
*H01H 1/00*   (2006.01)

(52) U.S. Cl.
CPC ......... *H01H 47/002* (2013.01); *G01R 31/327* (2013.01); *G01R 31/3274* (2013.01); *H01H 1/0015* (2013.01)

(58) Field of Classification Search
CPC .............. G01R 31/327; G01R 31/3271; G01R 31/3272; G01R 31/3275; G01R 31/3274;
(Continued)

(56) References Cited

U.S. PATENT DOCUMENTS 4,025,886 A * 5/1977 Barkan ..................... H01H 1/54
                                          335/147
5,424,637 A * 6/1995 Oudyn .................. H01F 7/1844
                                          324/207.16
(Continued)

FOREIGN PATENT DOCUMENTS

EP       3460822 A1    3/2019
WO       9824106 A1    6/1998
(Continued)

OTHER PUBLICATIONS

French Search Report and Written Opinion dated Mar. 11, 2021 for French Patent Application No. 2007585, 7 pages.

*Primary Examiner* — Judy Nguyen
*Assistant Examiner* — James Split
(74) *Attorney, Agent, or Firm* — Troutman Pepper Locke LLP

(57) ABSTRACT

A method for diagnosing an operating state of a switching device including separable contacts, which are driven by an electromagnetic actuator including a coil connected to an electronic control device, and sensors, which are configured to measure an intensity of a coil current and a coil voltage. The method comprises:
  a) receiving an order to close via the electronic control device;
  b) controlling the electromagnetic actuator so that it closes;
  c) measuring and recording the coil voltage and coil current values;
  d) calculating and recording values of a magnetic flux through the coil, by integrating the recorded values of the coil current, the coil voltage and resistance and inductance values of the coil; and
  e) evaluating and recording positions of a core of the electromagnetic actuator according to a data table,
(Continued)

which is previously recorded in the electronic control device and which defines a bijective relation between the position of the core, the magnetic flux and the coil current.

19 Claims, 7 Drawing Sheets

(58) Field of Classification Search
CPC ............ G01R 31/3277; G01R 31/3278; H01H 1/0015; H01H 47/002
See application file for complete search history.

(56) References Cited

U.S. PATENT DOCUMENTS

| | | | | |
|---|---|---|---|---|
| 6,208,497 | B1 * | 3/2001 | Seale | H02K 41/03 361/160 |
| 6,518,748 | B2 * | 2/2003 | Butzmann | F01L 9/20 324/207.16 |
| 6,657,847 | B1 * | 12/2003 | Wright | H01F 7/1844 361/160 |
| 6,859,350 | B1 * | 2/2005 | Corbetta | H01H 33/593 361/139 |
| 7,109,720 | B2 | 9/2006 | Baurand et al. | |
| 8,688,391 | B2 * | 4/2014 | Elsner | H01H 1/0015 702/34 |
| 9,733,292 | B2 * | 8/2017 | Delbaere | G06F 15/00 |
| 11,948,757 | B2 * | 4/2024 | Rushabh | G01R 31/3274 |
| 2017/0199231 | A1 | 7/2017 | Brunner et al. | |
| 2019/0018065 | A1 * | 1/2019 | Lapiere | H01H 11/0062 |
| 2019/0131047 | A1 * | 5/2019 | Priest | H01F 7/064 |
| 2019/0348243 | A1 * | 11/2019 | Chen | G01R 31/327 |
| 2020/0194191 | A1 * | 6/2020 | Ashtekar | G01R 31/3333 |

FOREIGN PATENT DOCUMENTS

| | | |
|---|---|---|
| WO | 03054895 A1 | 7/2003 |
| WO | 2015189027 A1 | 12/2015 |

* cited by examiner

METHOD FOR DIAGNOSING AN OPERATING STATE OF AN ELECTRICAL SWITCHING DEVICE AND ELECTRICAL SWITCHING DEVICE FOR IMPLEMENTING SUCH A METHOD

TECHNICAL FIELD

The present invention relates to a method for diagnosing an operating state of an electrical switching apparatus and to electrical switching apparatus for implementing such a method.

The invention more particularly relates to electrical contactors.

BACKGROUND

Such electrical switching apparatuses comprise an electromagnetic actuator comprising a coil and are configured to switch between an open state and a closed state, for example in order to control the supply of electrical power to an electrical load. Generally, the electrical contacts comprised fixed contacts and movable contacts, the latter being attached to a movable portion of the actuator that moves under the effect of a magnetic field created by the coil when a suitable electrical current flows through the latter. To guarantee a sufficient contact pressure between the electrical contacts, the movable portion of the actuator overruns by a distance, called the overrun, between the moment at which the movable contacts make contact with the fixed contacts, and the moment at which the actuator reaches its stable closed position. This overrun corresponds to a contact compression.

In each switching cycle, the contactor undergoes wear under the effect of various factors; for example, the electrical contacts wear under the effect of electric arcs generated as the electrical contacts open, the wear of the contactor manifesting itself by a loss of contact compression.

It would be desirable to be able to automatically estimate the wear level of a contactor while it is in operation, in order to be able to make provision for suitable maintenance during the life of said contactor and/or to detect the appearance of malfunctions.

It is known to incorporate a position sensor into the electromagnetic actuator, in order to directly measure the movement of the movable parts of the actuator and to deduce contact compression therefrom. However, the use of a sensor engenders an additional cost, and it is not always possible to integrate a sensor into a contactor.

WO-03/054895-A1 describes a method for diagnosing wear based on a measurement of the travel time of the movable core of the electromagnetic actuator in the closing phase. Such a diagnosing method only allows the time of the start of the movement and the time of the end of the movement of the core to be determined. Thus, one drawback of this method is that it does not allow the precise position of the core during the closing phase to be determined. This makes it more difficult to obtain reliable information on the state of the contacts and therefore on the wear state of the contactor.

SUMMARY

It is these problems that the invention more particularly remedies, by providing a diagnosing method that is more precise.

To this end, the invention relates to a method for diagnosing an operating state of a switching apparatus that is configured to be coupled to an electrical conductor and that comprises:

separable contacts that are associated with the electrical conductor and that are driven by an electromagnetic actuator comprising a coil connected to an electronic control device, which control device is configured to apply a coil command voltage across the terminals of the coil, and sensors that are configured to measure a magnitude of a coil current flowing through the coil and the coil voltage.

According to the invention, the method comprises steps consisting in:

receiving an order to close the switching apparatus, the switching apparatus initially being in an open state, the order to close being received by the electronic control device;

after the order to close has been received, commanding the electromagnetic actuator to close, by means of the electronic control device;

as the switching apparatus switches to the closed state, measuring and storing values of the coil voltage and coil current;

computing and storing values of a magnetic flux passing through the coil, by integration of the stored values of the coil current and coil voltage and of values of the resistance and inductance of the coil that are stored beforehand in the electronic control device;

on the basis of the stored values of the magnetic flux and coil current, evaluating and storing positions of a core of the electromagnetic actuator depending on a data table characteristic of the electromagnetic actuator, the data table being stored beforehand in the electronic control device and defining a bijective relationship between the position of the core, the magnetic flux and the coil current.

By virtue of the invention, the magnetic flux is computed throughout the closing phase on the basis of the measurements of coil voltage and of coil current. A value of the position of the movable core is deduced therefrom on the basis of the data table, which relates bijectively the position of the core, coil flux and coil current. The variation in the position of the mobile core in the closing phase is thus determined automatically, precisely, and without having to install a specific new sensor such as a position sensor, this being economical.

According to some advantageous but non-mandatory aspects of the invention, such a diagnosing method may incorporate one or more of the following features, either alone or in any technically permissible combination:

the step of computing the magnetic flux comprises an initial substep, referred to as the self-correction substep, followed by a computing substep, the self-correction substep consisting in, provided that the coil current is lower than a current referred to as the "start" current, below which the movable core is kept in the open position by a return member of the electromagnetic actuator, evaluating and storing an initial value of the magnetic flux, which value is referred to as the "initial flux", so that, when the coil current increases above the start current, the computation by integration of the magnetic flux in the computing phase takes into account the value of the initial flux;

in the step of commanding the electromagnetic actuator to close, the electronic control device commands the electromagnetic actuator to close when the coil current reaches 50% of the value of the start current, preferably, and more preferably the start current.

the method comprises a step consisting in computing, from the profile of the position, which profile is stored in the electronic control device, a closing time of the electromagnetic actuator, the closing time being equal to a time difference between the time at which the electronic control device commands the electromagnetic actuator to close and the time at which the electromagnetic actuator reaches its stable closed position;

the method comprises a step consisting in computing, by derivation with respect to time of the profile of the position stored in the electronic control device, a profile of the speed of movement of the switching apparatus and a profile of the acceleration of the switching apparatus, and in storing the speed and acceleration profiles in the electronic control device;

the method comprises a step consisting in computing, from the speed profile of the switching apparatus, a minimum compression speed of the core, the minimum compression speed being equal to a minimum of the speed of the core in a terminal segment of the movement of the core in the closing phase;

the method detects the precise times of closure of each contact associated with each pole of the switching apparatus by means of current sensors, the method combining the speed profile stored in the electronic control device and the precise times of closure of each contact to evaluate a closing speed of each contact; and a compression associated with the movable contacts of each pole is evaluated by combining the position profile of the core with the precise times of closure of each contact, the compression of each movable contact being equal to the difference between a final position of the core in its stable closed position and the position of the core at the precise time of closure of the contact in question.

The invention also relates to an electrical switching apparatus for implementing a diagnosing method such as described above, the switching apparatus being configured to be coupled to an electrical conductor and comprising:

separable contacts, which are moved between an open position and a closed position by an electromagnetic actuator comprising a coil and a movable core that is attached to the separable contacts, the switching apparatus having a structure that limits the generation of eddy currents;

a command circuit for controlling the voltage across the terminals of the coil, which voltage is referred to as the "coil voltage", the command circuit comprising a device referred to as the "release" device, which may be selectively activated in order to make drop the electrical current flowing through the coil, which is referred to as the "coil current", the coil voltage and the release device being activated or deactivated depending on the states of the command circuit;

sensors for measuring the coil current and coil voltage;

an electronic control device, which is configured to receive orders to open and close the switching apparatus, to receive the values of the measurements of coil current and coil voltage, and to control the states of the command circuit;

wherein the switching apparatus is configured to implement a diagnosing method comprising steps consisting in:
a) receiving an order to close;
b) commanding the electromagnetic actuator to close;
c) measuring and storing values of the coil voltage and coil current;
d) computing and storing values of a magnetic flux passing through the coil, by integration of the stored values of the coil current and coil voltage and of values, which are stored beforehand in the electronic control device, of the resistance and inductance of the coil;
e) on the basis of the stored values of the magnetic flux and coil current, evaluating and storing positions of the core depending on a data table characteristic of the electromagnetic actuator, the data table defining a bijective relationship between the position of the core, the magnetic flux and the coil current.

Advantageously, the switching apparatus comprises current sensors, which are configured to measure a magnitude of the electrical current flowing through each phase of the electrical conductor, the switching apparatus being configured to implement a diagnosing method comprising steps consisting in detecting a precise time of closure of the movable contacts associated with each phase, and in combining with the precise times of closure of each of the movable contacts the position profile of the core or the speed profile of the core, in order to evaluate a compression or a closing speed of each of the movable contacts.

This switching apparatus has the same advantages as those mentioned above with respect to the diagnosing method of the invention.

BRIEF DESCRIPTION OF THE DRAWINGS

The invention will be better understood and other advantages thereof will become more clearly apparent from the following description of one embodiment of a method for diagnosing an operating state of a contactor and of a contactor configured to implement such a method, which description is given solely by way of example and with reference to the appended drawings, in which.

DETAILED DESCRIPTION

Figure 1:
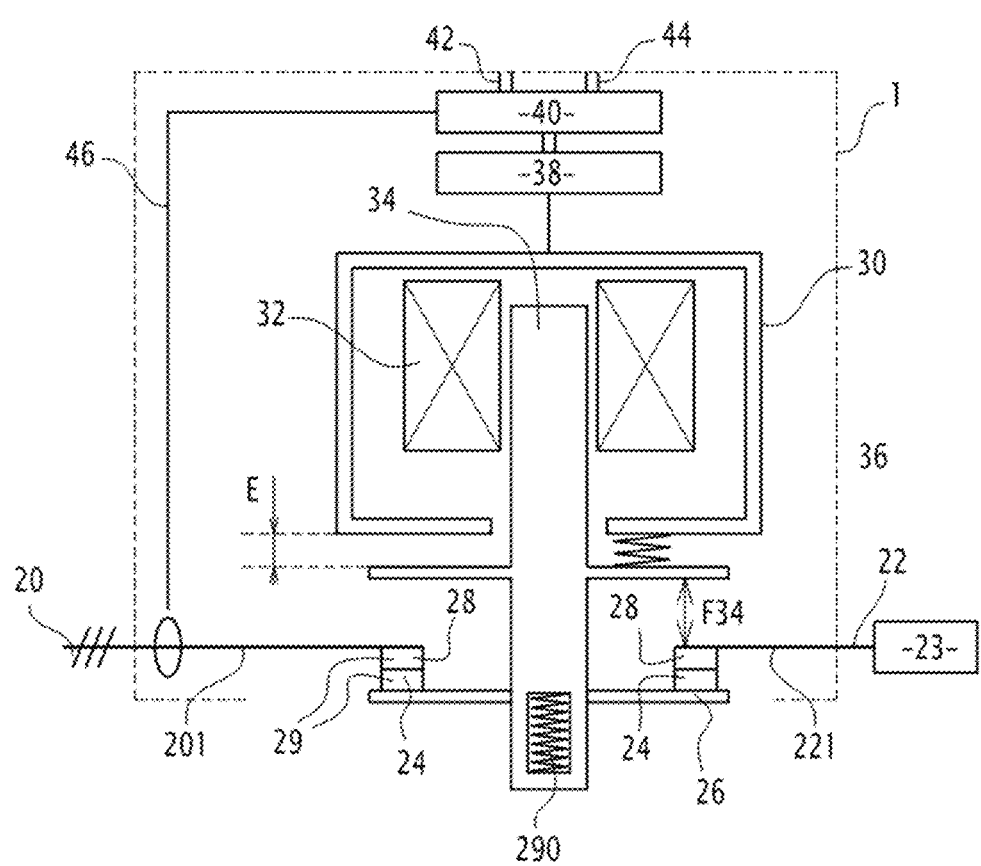
FIG. 1 is a schematic representation of an electric switching apparatus comprising an electromagnetic actuator, according to embodiments of the invention.

A contactor 1 is shown in FIG. 1. The contactor 1 is an example of an electrical switching apparatus intended to control the supply of electrical power from an electrical power source to an electrical load 23. The electrical power source has not been illustrated to simplify the figures. The power source is for example a mains grid, whereas the electrical load 23 is for example an electric motor that it is desired to control and/or protect by means of the contactor 1. The contactor 1 is generally housed in a casing, which has been represented here by a dashed rectangle. The contactor 1 is configured to be coupled, on the one hand, to an upstream electrical conductor 20 connected to an electrical power source and, on the other hand, to a downstream line 22 connected to the electrical load 23. When the contactor 1 lets electrical current pass and the electrical load 23 is supplied with power, the contactor 1 is in a state referred to as the "closed" state, whereas when the contactor 1 prevents the passage of electrical power to the electrical load, the contactor 1 is in a state referred to as the "open" state.

The electrical conductor 20 and the downstream line 22 comprise the same number of phases. When the electrical power source is multiphase, the electrical conductors 20 and the downstream line 22, which each comprise conductive wires that are insulated from one another, have as many conductive wires as each other, each conductive wire of the downstream line 22 being associated with one respective wire of the upstream electrical conductor 20. Whatever the number of phases, the contactor 1 is configured to interrupt, or to let pass, the electrical current conjointly in each of the phases.

In the illustrated example, the upstream electrical conductor 20 is three-phase. A single of the conductive wires of the electrical conductor 20, which has been referenced 201, is shown in FIG. 1. Only the conductive wire of the power line 22 associated with the conductive 201 has been shown, this conductive wire of the power line 22 being referenced 221.

The rest of the description will be given with reference to the conductive wires 201 and 221, which are associated with the same phase of the supply current, but it will be understood that what is described may be transposed to the other phases of the supply current.

For each phase, the contactor 1 comprises movable contacts 24, which are placed on a movable bar 26, and fixed contacts 28, which are attached to the upstream and downstream conductors 20, 22, respectively. Each of the movable and fixed contacts 24, 28 comprises contact pads 29, which are here made of metal, and preferably from a silver alloy or any equivalent material.

The movable bar 26 is movable between a closed position, in which the movable contacts 24 are electrically connected to the fixed contacts 28 and electrical power is able to flow through the movable bar 26 of the upstream electrical conductor 20 to the downstream line 22, and an open position, in which the removable contacts 24 are separated from the fixed contacts 28.

When the movable bar 26 is in closed position, the contactor 1 is in the closed state, whereas when the bar 26 is in open position, the contactor 1 is in the open state. The passage from the open state to the closed state is a phase of closing of the contactor 1, whereas the passage from the closed state to the open state is a phase of opening the contactor 1.

In practice, in each cycle comprising a closing and opening phase, the contact pads 29 wear, for example under the action of electric arcs generated as the contactor opens, or even because of material being torn away as a result of micro-welds. The consequence of this loss of material is that the thickness of the contact pads 29 decreases throughout the life of the contactor 1, this increasing the amplitude of the movement of the bar 26 during opening and closing phases. To remedy this, the contactor 1 comprises a mechanism 290, which has been schematically represented by a spring in FIG. 1, that is attached to the bar 26 and that allows the fixed and movable contacts 28, 24 to be kept in electrical contact with a sufficient contact pressure.

When the thickness of the contact pads 29 is insufficient or when the surface finish of the pads 29 is poor, the risk of malfunction of the contactor 1 increases and it is recommendable to replace the contactor 1; it is for these reasons that a diagnosis of the compression state of the contacts of the contactor 1 allows the advance of the degradation of the contactor 1 to be evaluated.

The movable bar 26 is driven by an electromagnetic actuator 30, which comprises a command electromagnet with a coil 32, a core 34 attached to the movable bar 26 and a return member 36, a spring or equivalent for example. The coil 32 is configured to generate a magnetic field when it is powered with an electrical command current, in order to cause the core 34, and therefore the movable bar 26, to move. The movements of the core 34 between the open and closed positions have been represented by a double-headed arrow F34. In other words, the movable contacts 24 and the associated fixed contacts 28 together form separable contacts, which are associated with the electrical conductor 20 and which are moved between an open position and a closed position by the electromagnetic actuator 30, which comprises a coil 32 and a movable core 34 that is attached to the separable contacts.

In FIG. 1, the contactor 1 has been shown in an intermediate configuration between the stable open and closed states of the contactor 1, in which intermediate configuration the fixed and movable contacts 28, 24 are electrically connected, but the core 34 is not in abutment in the closed position. The mechanism 290 permits an overrun of the core 34 between the moment at which the fixed contacts 28 make contact with the movable contacts 24, and the moment at which the actuator 30 is in its stable closed position. This overrun, which corresponds to the contact compression, is denoted E in FIG. 1.

The electromagnetic actuator 30 is controlled by way of a supply circuit 38, itself controlled by an electronic control device 40. The coil 32 is thus connected to the electronic control device 40.

According to some embodiments, the electronic control device 40 comprises a central processing unit (CPU), such as a programmable microcontroller, a microprocessor or the like, and a computer memory forming a storage medium for computer-readable data.

According to some examples, the memory is a ROM memory, a RAM memory, or an EEPROM or flash non-volatile memory or the like. The memory comprises executable instructions and/or computer code for ensuring the operation of the control device 40 in accordance with one or more of the embodiments described below when executed by the central processing unit.

As variants, the electronic control device 40 may comprise a digital signal processor (DSP), or a field-programmable gate array (FPGA), or an application-specific integrated circuit (ASIC), or any equivalent element.

The electronic control device 40 is itself connected to a power supply rail 42 and comprises an interface 44 configured to receive, from a user, orders to open or close the contactor 1. The electronic control device 40 is here shown as being integrated into the contactor 1. As a variant, the control device 40 is remote, i.e. it is not integrated into the same casing as the electromagnetic actuator 30.

The power supply rail 42 has a preferably stable and DC voltage and is intended to supply the electronic control device 40 and the supply circuit 38 with power. The interface 44 has been represented here by command electrodes. For example, an electrical command voltage may be applied across the command electrodes. Optionally, the interface 44 comprises wireless communication means.

In certain embodiments, the contactor 1 also comprises current sensors 46, configured to measure a current flowing through each of the phases of the upstream line 20, or in other words a current flowing through each of the conductive wires 201 of the upstream line 20. In other embodiments, the current sensors 46 and the electronic control device 40 are integrated into a casing separate from the contactor 1.

When the coil 32 is supplied with electrical power delivered by the power supply rail 42, an excitation current passes through the coil 32, which generates an electromagnetic force that tends to attract the core 34 and the bar 26 from the open position to the closed position. A return member 36, represented here by a spring, exerts a return force that opposes the force of attraction of the electromagnet.

A coil current $I_{BOB}$ is defined as being an excitation current flowing through the coil 32.

A start current $I_D$ is defined as being a threshold of the coil current $I_{BOB}$ that, when the actuator 1 is in the open state, allows the actuator 1 to move to the closed state, as soon as the coil current $I_{BOB}$ increases above the start current $I_D$.

A stall current $I_S$ is defined as being a threshold of the coil current $I_{BOB}$ that, when the actuator 1 is in the closed state, allows the actuator 1 to move to the open state, as soon as the coil current $I_{BOB}$ decreases below the stall current $I_S$.

Thus, when that the actuator 1 is in the open state, provided that the coil current $I_{BOB}$ remains below the start current $I_D$, the movable core 34 is repulsed to the open position by the return member 36 of the actuator 30 and the contactor 1 remains in the open state. If the coil current $I_{BOB}$ increases above the start current $I_D$, the electromagnetic force of the coil 32 becomes higher than the return force of the member 36 and the core 34 then moves from its open position to its closed position. Such a situation corresponds to a phase of closing the contactor 1.

In contrast, when the actuator 1 is in the closed state, provided that the coil current $I_{BOB}$ remains higher than the stall current Is, the contactor 1 remains in the closed state. If, while the contactor 1 is in the closed state, the coil current $I_{BOB}$ decreases below the stall current $I_S$, the electromagnetic force of the coil 32 drops below the return force of the member 36 and of the mechanism 290; the core 34 is then repulsed from its closed position to its open position under the effect of the return member 36 and of the mechanism 290. Such a situation corresponds to a phase of opening the contactor 1.

Generally, the start current $I_D$ is higher, in absolute value, then the stall current $I_S$. The values of the start and stall currents $I_D$, $I_S$ are adjusted during the design of the actuator 1, especially by adjusting the properties of the coil 32 or the return forces of the member 36 and of the mechanism 290.

Figure 2:
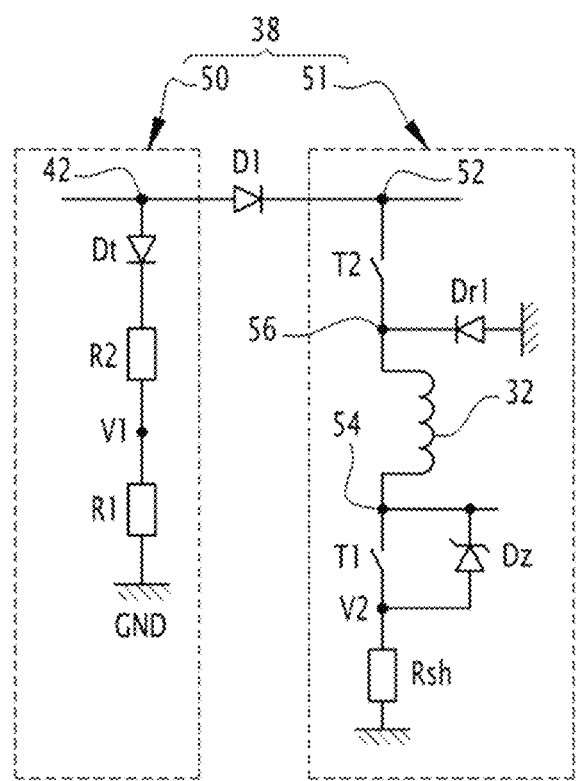
FIG. 2 is a schematic view of an example of the command circuit for controlling the electromagnetic actuator of the switching apparatus of FIG. 1.

An exemplary embodiment of the supply circuit 38 is schematically shown in FIG. 2. The architecture of the supply circuit 38 is nonlimiting, and other arrangements of the various components of the supply circuit 38 are possible, and indeed other electrical or electronic components may be used to perform the same functions.

The supply circuit 38 preferably comprises a measurement circuit 50, shown in the left-hand dashed rectangle, configured to measure the value of the electrical voltage between the supply rail 42 and an electrical ground GND of the supply circuit 38.

For example, the measurement circuit 50 comprises two resistors R1 and R2 that are connected in series with a diode Dt between the power supply rail 42 and the electrical ground GND. A first measurement point, here placed between the resistors R1 and R2, allows a first measurement voltage V1 representative of the voltage present between the power supply rail 42 and the electrical ground GND to be collected. Since the electrical voltage present between the rail 42 and the ground GND is related to the coil voltage $U_{BOB}$, the measurement circuit 50 is by extension an example of a sensor configured to measure coil voltage $U_{BOB}$.

The supply circuit 38 comprises a command circuit 51, which includes the coil 32. A diode D1 may be placed on the power supply rail 42 between the command circuit 51 and the measurement circuit 50 in order to prevent any return of current to the latter. The diodes D1 and Dt are preferably of the same type.

The command circuit 51 is here shown in a configuration referred to as the "release" configuration, which is described in more detail further on in the present description.

The command circuit 51 comprises a supply terminal 52, which is connected to the power supply rail 42. The coil 32 comprises two terminals 54 and 56. A measurement of the voltage between the terminals 54 and 56 thus allows a coil voltage, which is denoted $U_{BOB}$, to be measured.

The terminal 54 is connected to ground GND via a switch t1 referred to as the "release" switch. In many embodiments, a resistor Rsh, referred to as the shunt resistor, is connected in series with the release switch T1 in order to collect a second measurement voltage V2 representative of the electrical current flowing through the coil 32, or in other words representative of the coil current $I_{BOB}$. In the illustrated example the shunt resistor Rsh is connected between the release switch T1 and ground GND. The resistor Rsh is an example of a sensor configured to measure the magnitude of the coil current $I_{BOB}$ flowing through the coil 32.

The terminal 56 is, on the one hand, connected to the terminal 52 by way of a supply switch T2 and, on the other hand, connected to ground GND by way of a diode, which is referred to as the "flyback" diode Drl. The flyback diode Drl has a blocking direction oriented toward the terminal 56.

The switches T1 and T2 are switches that are controlled by a command signal originating from the electronic control device 40. In other words, the electronic control device 40 is configured to control the states of the command circuit 51.

According to some examples of implementation, the switches T1 and T2 are semiconductor power switches, such as MOSFETs, or thyristors, or insulated-gate bipolar transistors (IGBT), or any other equivalent devices.

The command circuit 51 comprises a "release" device Dz, which here takes the form of a Zener diode connected in parallel to the release switch T1. Thus, when the release switch T1 is opened, the coil current $I_{BOB}$ passes through the release device Dz, whereas when the release switch T1 is closed, the release device Dz is short-circuited and no current passes through the release device Dz. The release device Dz is thus selectively activatable to make the coil current $I_{BOB}$ drop.

In the context of the present invention, the characteristic quantities of the components of the supply circuit 38 are considered to be known. In particular, the coil 32 has a resistance denoted $R_{BOB}$ and an inductance denoted $L_{BOB}$. The resistance $R_{BOB}$ and inductance $L_{BOB}$ especially depend on the geometry of the coil 32, on the materials used, on temperature, etc. The values of the resistance $R_{BOB}$ and inductance $L_{BOB}$ are thus considered to be known.

Figure 3:
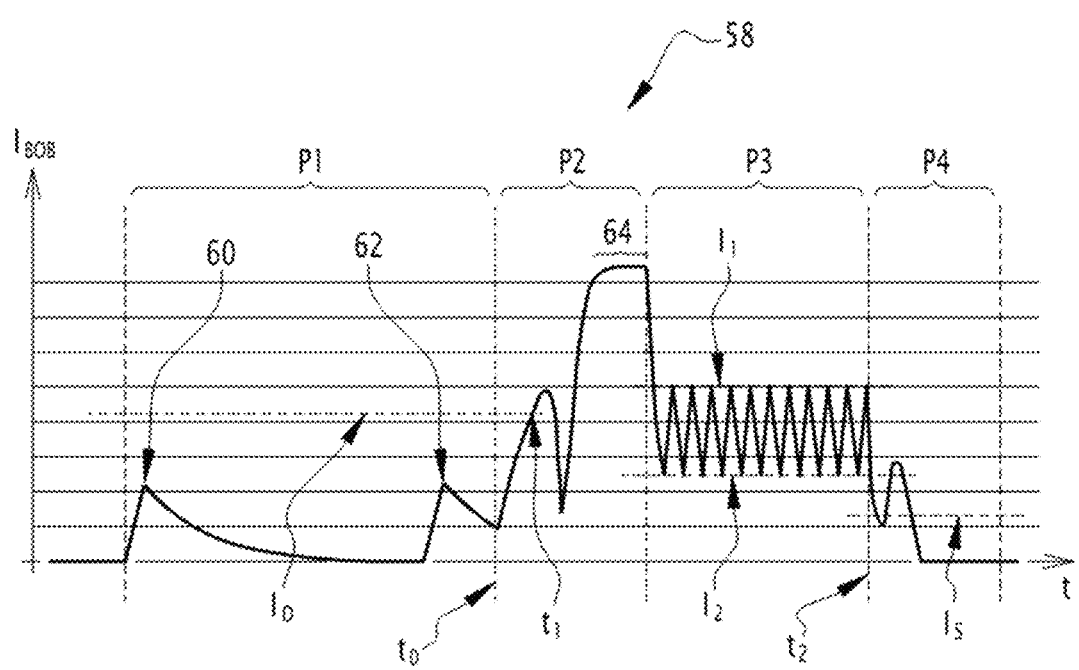
FIG. 3 is a graph showing the variation in an electrical command current of the electromagnetic actuator of FIG. 2, in a plurality of operating phases.

FIG. 3 shows a graph 58 illustrating the variation in the coil current $I_{BOB}$ flowing through the coil 32 over time (t) in various successive operating phases of the contactor 1, which phases are denoted P1, P2, P3 and P4, in the case where the contactor is switched to the closed state, then switched back to the open state.

The phase P1 is an initial phase, during which the contactor 1 is stably in the open state, i.e. the coil current $I_{BOB}$ does not exceed the start current $I_D$. In FIG. 3, the coil current $I_{BOB}$ contains transient peaks 60 and 62, which are lower than the start current $I_D$ and which are related to operations for testing the contactor 1, these testing operations not being described in detail in the present description.

The phase P2 corresponds to a closing phase, after an order to close has been received by the contactor 1. The phase P2 starts when the electronic control device 40 receives, at a time $t_0$, an order to close via the interface 44.

The electronic control device 40 is configured to apply the command coil voltage $U_{BOB}$ to the terminals of the coil 32. For example, the control device 40 then commands the release switch T1 and the supply switch T2 to close. The coil voltage $U_{BOB}$ is then equal to the voltage delivered by the power supply rail 42, minus the voltage across the terminals of the shunt resistor Rsh. The coil current $I_{BOB}$, which is initially zero, then increases to exceed the start current $I_D$ at a time $t_1$, from which the core 34 begins to move from its open position to its closed position.

Next in the closing phase P2, the movable contacts 26 reach abutment against the fixed contacts 28; the contactor 1 is then in the closed state. The core continues to move until it makes contact with the fixed portion 30 of the magnetic circuit, this corresponding to the overrun that compresses the electrical contacts.

More generally, when the electrical power source comprises a plurality of electrical phases, the pads 29 associated with each of the electrical phases do not all have the same wear, or in other words do not all have the same compression. The exact time of the closure of each of the electrical phases differs depending on the electrical phase.

In a last phase 64 of the closing phase P2, transitory effects have ended, and the coil current $I_{BOB}$ exhibits a plateau value, equal to the coil voltage $U_{BOB}$ divided by the coil resistance $R_{BOB}$ and strictly higher than the stall current $I_S$. The contactor 1 is then stably in the closed state.

In the phase 64, the coil 32 consumes electrical power, in particular via Joule heating, the power consumed by the coil 32 via Joule heating being equal to $R_{BOB} \times (I_{BOB})^2$. The contactor 1 remains in the closed state provided that the coil current $I_{BOB}$ is kept above the stall current $I_S$. It is therefore possible to decrease the power consumption of the coil 32 while keeping the contactor 1 stably in the closed state $I_{BOB}$, by decreasing the magnitude of the coil current $I_{BOB}$, provided that the coil current $I_{BOB}$ remains higher than the stall current $I_S$.

This is for example achieved by varying the coil voltage $U_{BOB}$, so as to decrease as much as possible the coil current $I_{BOB}$ while maintaining it above the stall current $I_S$. Such a situation corresponds to a holding phase P3.

In the illustrated example, the variation in the coil voltage $U_{BOB}$ is achieved by alternatively opening and closing the supply switch T2, this creating a periodic signal, chopping the coil voltage $U_{BOB}$ with a square-wave profile at a frequency F3.

In the holding phase P3, when the supply switch T2 is open, the release switch T1 remains closed. The command circuit 51 is then in a mode referred to as the "flyback" mode. The command circuit 51 being limited to the coil 32 connected to the flyback diode Drl and to the shunt resistor Rsh. The coil current $I_{BOB}$ then decreases, the electrical energy mainly being dissipated by the resistance $R_{BOB}$ of the coil 32. The supply switch T2 is then closed before the coil current $I_{BOB}$ decreases below the stall current $I_S$, and the coil current $I_{BOB}$ once again increases.

As a result, the coil current $I_{BOB}$ varies periodically at a frequency equal to the frequency F3 of the coil voltage $U_{BOB}$, the coil current $I_{BOB}$ here having a saw-tooth profile, varying between a low threshold $I_1$, strictly higher than the stall current $I_S$, and a high threshold $I_2$, higher than the low threshold $I_1$. The low threshold $I_1$ is for example chosen to be 5% higher than the stall current $I_S$. The high threshold $I_2$ especially depends on the characteristics of the coil 32, such as the coil resistance $R_{BOB}$ and the coil inductance $L_{BOB}$.

The periodic nature of the coil current $I_{BOB}$ causes mechanical vibration of the electromagnetic actuator 30. To prevent this vibration from generating noise perceivable to the human ear, the frequency F3 is advantageously chosen to be lower than 100 Hz, or higher than 25 kHz. In the illustrated example, the frequency F3 is 100 Hz.

The opening phase P4 starts when the electronic control device 40 receives in order to open, at a time $t_2$.

The electronic control device 40 commands the electromagnetic actuator 30 to open, this being achieved here by opening the supply switch T2 and opening the release switch T1, so as to make drop the voltage across the terminals of the coil 32. The coil current $I_{BOB}$ then flows through the flyback diode Drl, the coil 32, the flyback device Dz and the shunt resistor Rsh. The control circuit 51 is then in a mode referred to as the "release" mode, in which the coil current $I_{BOB}$ decreases faster than in the flyback mode.

When the coil current $I_{BOB}$ drops below the stall current Is, the return member 36 and the mechanism 290 repulse the movable contacts 24 from their closed position to their open position.

Once transient induction effects have ended, the coil current $I_{BOB}$ is zero, and the contactor 1 is once again stably in the open state.

The electrical and electromagnetic quantities of the coil 32 will now be described.

A magnetic flux $\phi$ is generated when the coil current $I_{BOB}$ flows through the coil 32. The value of the magnetic flux $\phi$ especially depends on the value of the coil current $I_{BOB}$ and on the position of the movable core 34.

For example, the value of the magnetic flux $\phi$ is related to the values of the coil voltage $U_{BOB}$ and coil current $I_{BOB}$ by the following equation, denoted Math 1 below:

$$U_{BOB} = R_{BOB} \cdot I_{BOB} + N \frac{d\phi}{dt} \qquad \text{[Math 1]}$$

in which N is the number of turns of the coil 32 and $\phi$ is the magnetic flux passing through each turn of the coil 32.

A position x is defined as a position of the core 34 with respect to the coil 32. In many embodiments, the core 34 may move translationally with respect to the coil 32 along an axis of movement. The position x is then defined along this axis of movement. By convention, the position x is zero when the contactor 1 is in the open state. For each of the electrical phases of the contactor 1, the position of the movable contacts 24 is thus related to the position x. By extension, the position x also represents a position of the electromagnetic actuator 30 or of the contactor 1.

By deriving φ in the equation Math 1, a general equation Math 2 describing the electromagnetic quantities in the actuator 1 is obtained:

$$U_{BOB} = R_{BOB} \cdot I_{BOB} + N\frac{d\phi}{dI_{BOB}}\frac{dI_{BOB}}{dt} + N\frac{d\phi}{dx}\frac{dx}{dt} + N\frac{d\phi}{di_f}\frac{di_f}{dt} \quad \text{[Math 2]}$$

in which the last term $$N\frac{d\phi}{di_f}\frac{di_f}{dt}$$

contains eddy currents, which are denoted $i_f$.

In the context of the present invention, the contactor 1 has a structure that limits the generation of eddy currents $i_f$, this allowing the last term of the equation Math 2 to be neglected. According to some nonlimiting examples, the contactor 1 has a sheet-based laminated structure, which is produced by stacking cut sheets and which has a very low conductivity along the stacking axis of the sheets, especially because of sheet edge discontinuities. The resulting low overall conductivity is the cause of the few eddy currents generated by this type of contactor 1.

Figure 4:
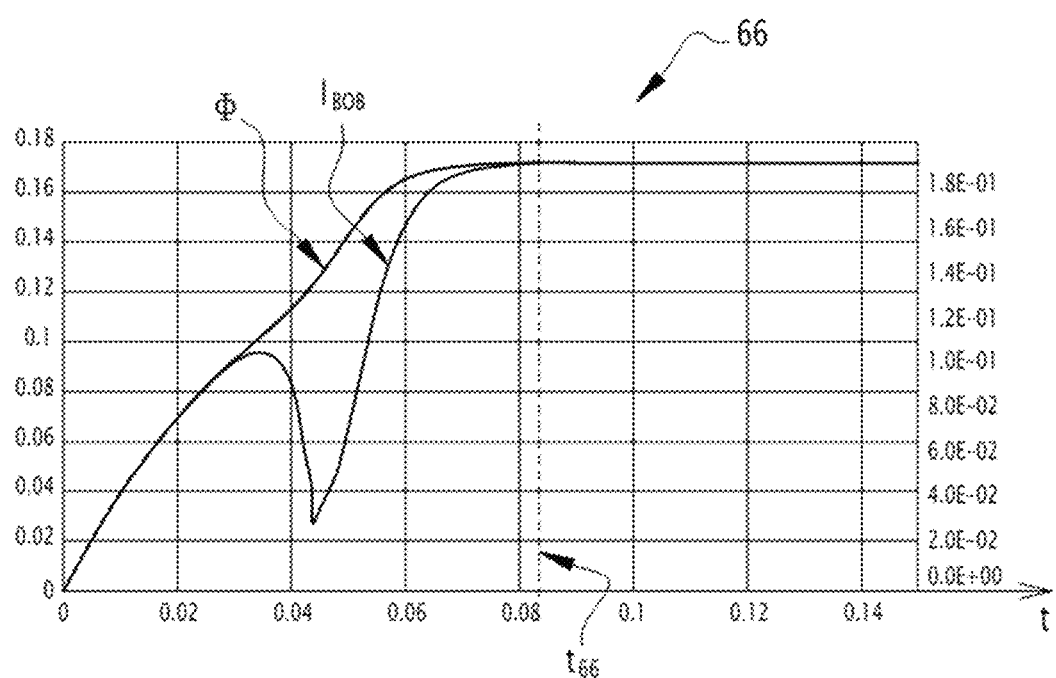
FIG. 4 is a graph showing the variation in an electrical command current and in a magnetic flux of the electromagnetic actuator of FIG. 2, as measured in a phase of closing the actuator.

An illustration of this effect of decrease in eddy currents $i_f$ is shown in FIG. 4, which shows a graph 66 illustrating the variation in the coil current $I_{BOB}$ and in the magnetic flux φ in a phase of closing the contactor 1. The absence of eddy currents $i_f$ manifests itself in the absence of phase shift between the coil flux φ and the coil current $I_{BOB}$, which each reach a plateau value at the same time.

Since the eddy currents are neglected, the magnetic circuit has a reluctance Rel that is, on the one hand, dependent on the position x of the movable core 34 and on the coil current $I_{BOB}$, and that is, on the other hand, related to the magnetic flux φ and to the coil current $I_{BOB}$ by the following relationship $Rel(x,I_{BOB}) \cdot \phi = N \cdot I_{BOB}$.

In other words, the magnetic flux φ is a function of the position x and of the coil current $I_{BOB}$. The magnetic flux φ is expressible in the form of an analytic relationship, or indeed, to obtain high precision, by a two-dimensional response surface generated by tools for simulating the magnetic circuit of the contactor 1.

In the vast majority of cases, the surface $\phi = f(x,I_{BOB})$ has a bijective character, i.e. for a given coil current $I_{BOB}$, to a given value of the position x corresponds a single value of the magnetic flux φ. This allows an inverse function $x = g(\phi, I_{BOB})$ giving the value of the position x as a function of the flux φ and of the coil current $I_{BOB}$ to be reconstructed.

The surface $\phi = f(x,I_{BOB})$, or indeed its inverse function $x = g(\phi, I_{BOB})$, is stored in the memory of the electronic control device 40, for example in the form of a data table characteristic of the electromagnetic actuator 30, the data table defining a bijective relationship between the position x of the core 34, the coil flux φ and the coil current $I_{BOB}$.

The magnetic flux φ is also given by integration with respect to time of the equation Math 1. The following equation Math 3 is then obtained:

$$\phi(t) = \int \frac{U_{BOB} - R_{BOB} \cdot I_{BOB}}{N} \cdot dt + \phi_0 \quad \text{[Math 3]}$$

in which $U_{BOB}$ and $I_{BOB}$ are measured, N, dt and $R_{BOB}$ are known and $\phi_0$ is an initial value of the magnetic flux φ.

The magnetic flux φ may be computed using the equation Math 3 using numerical computing methods that are implemented by the electronic control device 40.

The shorter the integration time interval dt, in other words the shorter the integration stage, the smaller the computation error. The interval dt is for example proportional to the inverse of a clock frequency of the central processing unit of the electronic control device 40. According to some examples, the clock frequency of the device 40 is 1 kHz.

When the initial flux $\phi_0$ is zero, it is possible to compute the variation in the value of the flux φ directly from the measurements of $U_{BOB}$ and $I_{BOB}$, and to determine, using the inverse function $x = g(\phi, I_{BOB})$, the variation in the position x of the movable core 34. Thus, the position of the movable core 34 in the phase of closing the contactor may be precisely determined without there being any need to install a specific sensor such as a position sensor.

In certain cases, the initial flux $\phi_0$ is not zero, for example when certain parts of the electromagnetic actuator 30 have, over time, a remnant magnetisation, or indeed when the electromagnetic actuator 30 comprises, by design, a permanent magnet. It is then necessary to determine the initial flux $\phi_0$ in order to decrease the imprecision in the computation of the position x. An estimate $\hat{\phi}_0$ of the initial flux is defined.

A first method consists in determining the value of the initial flux $\hat{\phi}_0$ using the known response surface $\phi = f(x,I_{BOB})$, by estimating an initial value of the position x, which is denoted estimate $\hat{x}_0$. The estimate $\hat{x}_0$ may for example be computed via the coil inductance $L_{BOB}$, which is known, the coil current $I_{BOB}$ being measured. Then, $\hat{\phi}_0 = f(\hat{x}_0, I)$.

However such a first method of determining the estimated value $\hat{x}_0$ of the position is relatively approximate and especially does not allow variability in magnetic-gap dimensions to be taken into account. For example, mating of surfaces, or contamination of the surfaces in abutment in the open position, may lead to a variation in this considered to be open estimated position $\hat{x}_0$, this leading to an error in the estimate of the initial flux $\hat{\phi}_0$ and therefore to an error in the reconstruction of the position x in the closing phase.

A second method, referred to as the self-correction method, is based on the fact that the movable core 34 remains stationary in the open position provided that the coil current $I_{BOB}$ is lower than the start current $I_D$, i.e. between the times $t_0$ and $t_1$ of the phase P2.

In other words, at any time t comprised between $t_0$ and $t_1$, provided that the coil current $I_{BOB}$ is lower than the start current $I_D$, when the magnetic flux φ is computed using the equation Math 3 and when the position x at the time t is deduced using the inverse function $x = g(\phi, I_{BOB})$, if the computed position x does not remain constant, in other words if $x(t) \neq x(t_0')$, it means that there is an error in the estimated initial flux $\hat{\phi}_0$. The magnetic flux φ at the time t is then compensated for to correct this error. The magnetic flux φ is corrected a plurality of times, in a plurality of successive computations and provided that the time t is comprised between $t_0$ and $t_1$, until the estimated initial flux $\hat{\phi}_0$ and the actual flux $\phi_0$ converge. As a result of the self-correction method, the initial flux $\phi_0$ is known in a precise manner.

Thus, when the coil current $I_{BOB}$ exceeds the start current $I_D$ and the position x starts to change, the initial flux $\phi_0$ is estimated in a precise manner, this initial flux value $\phi_0$ allowing, in its turn, the position x to be computed in a precise manner.

Figure 5:
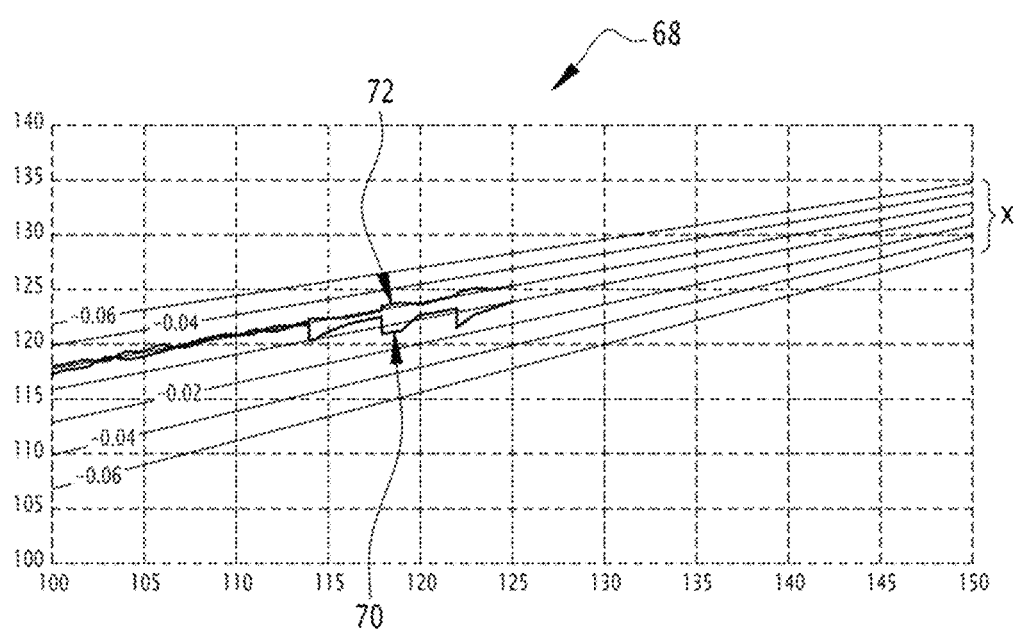
FIG. 5 is a graph illustrating one of the steps of the diagnosing method.

FIG. 5 shows a graph 68 illustrating an example of implementation of the self-correction method. In this graph

68, the curve 70 shows the magnetic flux ϕ computed with self-correction, depending on the coil current $I_{BOB}$ multiplied by the number of turns, the initial position x being set, and the estimate of the initial flux $\phi_0$ being erroneous. In the example, the initial position is $\hat{x}_0=0$ mm, whereas the initial flux $\hat{\phi}_0$ is the magnetic flux corresponding to a position x=+0.02 mm. It may be seen that there are divergences in the magnetic flux ϕ with respect to a characteristic corresponding to a set position x, leading to a series of self-corrections until the estimated flux and the real flux ϕ converge. The convergence of the estimated flux leads to a stable computed position x, which corresponds to the actual position x.

Curve 72 shows the magnetic flux ϕ computed with self-correction, without error in the initial flux $\phi_0$. In the example, $\hat{x}_0=+0.02$ mm, and the initial flux $\hat{\phi}_0$ is the magnetic flux corresponding to this position x=+0.02 mm. The computed flux indeed follows a characteristic of set position and requires no correction.

Figure 6:
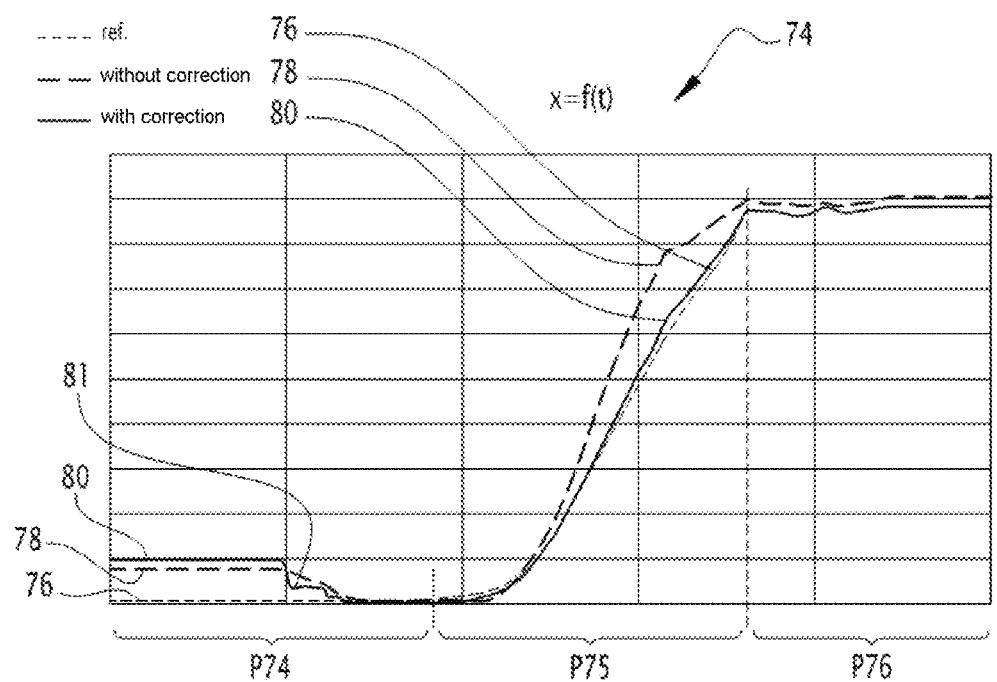
FIG. 6 is a graph illustrating a result of the diagnosing method.

FIG. 6 shows a graph 74 illustrating the effect that the self-correction method has on the determination of the position x. A curve 76 (dashed line) shows the variation in the position x, the position x being measured directly using a sensor of the position of the movable core 34 for the purposes of comparison with the results of the method described above. It will be understood that in practice the contactor 1 is normally devoid of such a position sensor.

In an initial phase P74, the measured position x remains constant. In a phase P75, after the initial phase P74, the core 34 moves from its closed position to its open position, and the position x varies. In a phase P76, after the phase P75, the core 34 is in its stable open position, and the position x no longer varies.

A curve 78 (thick dashed line) shows the variation in the position x, computed using the method described above without self-correction. The estimated initial flux $\hat{\phi}_0$ is erroneous and is not corrected.

A curve 80 shows the variation in the position x in a closing phase, computed using the method described above, with self-correction, the initial conditions being identical to those of the computation of the curve 78. The estimated initial flux $\hat{\phi}_0$ is erroneous but is corrected.

In an initial phase P74, the position x remains constant. Curve 80 contains stair-shaped changes 81 that result from the implementation of the self-correction procedure. Moreover, curve 80 joins curve 76 despite the uncertainty in the initial flux $\phi_0$. As a result, in phases P75 and P76, curve 80 corresponds better to curve 76 than curve 78, this demonstrating the positive effect of the self-correction method. It is not necessary to install a position sensor to reliably determine the variation in the position x as a function of time in the closing phase P2. The self-correction method is advantageously implemented in all cases, whether the electromagnetic actuator 30 comprises a permanent magnet or not.

The data on the position of the movable core 34 that are thus generated allow various conclusions to be drawn as to the state of the contactor 1.

For example, reconstruction of the position x=ƒ(t) allows the conformity of the travel of the movable core 34 and the final state of the actuator 1 to be verified, in order to detect potential defects of mechanical nature.

Through a closing time, equal to a time difference between the order to close and the end of mechanical travel of the actuator 1, it is possible to verify the absence of friction or blockages of mechanical origin.

By differentiating the position x=ƒ(t) with respect to time, a speed of movement of the movable core 34 is computed.

In the closing phase P2, a minimum speed in the overrun that leads to the compression of the moveable contacts 24 is an advantageous observer of the ability of the contactor 1 to close stably. Too low a minimum speed is an indication of a lack of magnetic force or of excessively high friction within the closing device 30.

Figure 7:
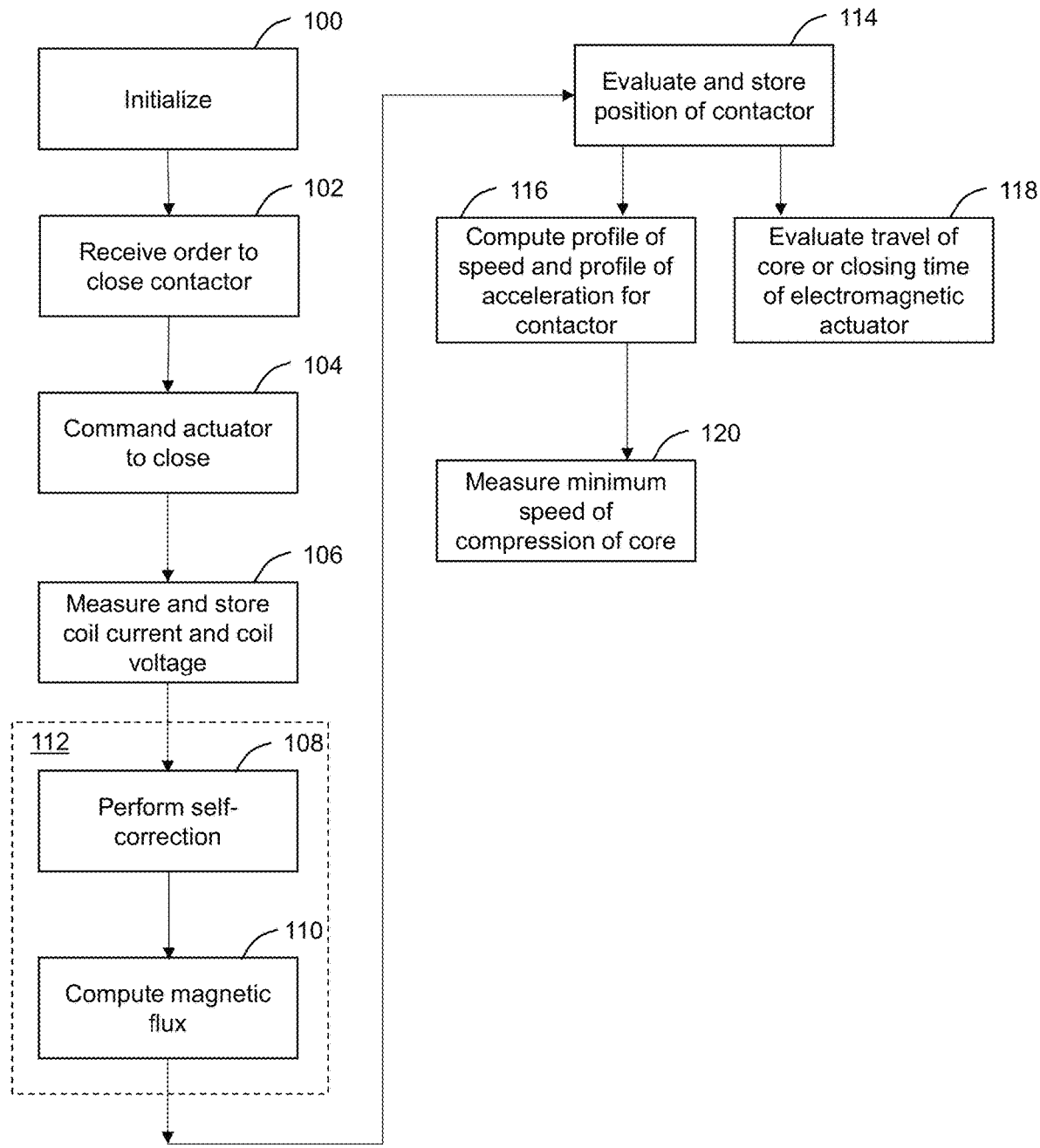
FIG. 7 is a chart showing steps of a method for diagnosing properties of the switching apparatus of FIG. 1, according to embodiments of the invention.

An example of operation of a method for estimating properties of the contactor 1 according to one preferred embodiment will now be described with reference to FIG. 7. However, as a variant, the steps of this method could be executed in a different order. Some steps could be omitted. The described example does not prevent, in other embodiments, other steps from being implemented conjointly and/or sequentially with the described steps.

In a step 100, the method is initialized while the contactor 1 is initially in a stable open state, in the initial phase P1 for example. The electronic control device 40 is waiting for an order to close the contactor 1.

Next, in a step 102, the electronic control device 40 receives an order to close the contactor 1. The time $t_0$ of reception of the order to close is the start of the closing phase P2.

Next, in a step 104, the electronic control device 40 commands the actuator 30 to close. The command to close here consists in applying the command coil voltage $U_{BOB}$ across the terminals of the coil 32 by closing the switches T1 and T2.

In the example illustrated in FIG. 3, the order to close is received in the particular case where the coil current $I_{BOB}$ is non-zero, following a transient peak 62 related to a testing operation. In some examples, the coil current $I_{BOB}$ is zero when the order to close is received. In all cases, the electromagnetic actuator 30 is in its stable open position when the order to close is received and when the electronic control device 40 commands the electromagnetic actuator 30 to close, i.e. the coil current $I_{BOB}$ is strictly lower than the start current $I_D$.

Next, in a step 106, the electronic control device 40 measures and stores the coil current $I_{BOB}$ and coil voltage $U_{BOB}$, the measurements continuing for example until the electromagnetic actuator 30 stably reaches its closed position, or indeed for a length of time which is stored in the electronic control device 40, this length of time being equal for example to 5 periods of a 50 Hz supply current, i.e. to 100 ms.

The fact that the electromagnetic actuator 30 is stably in the closed position may be detected in various ways. For example, by testing the position x of the core 34, or else when the coil current $I_{BOB}$ reaches a plateau value, substantially equal to $U_{BOB}/R_{BOB}$, in the phase 64.

Next, the method comprises a step 112 of computing and storing the magnetic flux ϕ flowing through the coil 32.

Step 112 comprises a substep 110 in which the magnetic flux ϕ is computed by integration of the stored values of the coil current $I_{BOB}$ and coil voltage $U_{BOB}$ and of values, stored beforehand in the electronic control device 40, of resistance $R_{BOB}$ and inductance $L_{BOB}$ of the coil 32.

Step 112 advantageously comprises an initial self-correction substep 108, after the substep 110, the self-correction substep consisting in, provided that the coil current $I_{BOB}$ is lower than the start current $I_D$ and that the core 34 is kept in open position by the return member 36 of the actuator 1, evaluating and storing an initial value of the magnetic flux $\phi_0$, the computation by integration of the magnetic flux ϕ in the substep 110 taking into account the value of the initial flux $\phi_0$ computed in the self-correction substep 108.

According to some examples, the self-correction substep 108 lasts from the time $t_0$ to the time $t_1$, whereas substep 110 starts at the time $t_1$. In other words, when the coil current $I_{BOB}$ increases above the start current $I_D$, the computation by integration of the magnetic flux $\phi$ in the computing substep 110 takes into account the value of the initial flux $\phi_0$.

Preferably, in step 104, the electronic control device 40 commands the electromagnetic actuator 30 to close when the coil current $I_{BOB}$ is sufficiently low, so that the self-correcting substep 108 lasts long enough for the computation of the initial flux $\phi_0$ to converge. Thus, in the step 104 of commanding the actuator 30 to close, the electronic control device 40 commands the electromagnetic actuator 30 to close when the coil current $I_{BOB}$ reaches 50% of the start current $I_D$, preferably 20%, and more preferably 10%, of the start current $I_D$.

Next, the method comprises a step 114 consisting in evaluating and storing the position x of the contactor 1 on the one hand on the basis of the stored values of the magnetic flux $\phi$ and of the coil current $I_{BOB}$ and, on the other hand, depending on a data table characteristic of the coil 32, the data table being stored beforehand in the electronic control device 40 and defining a bijective relationship between the position x of the core 34, the magnetic flux $\phi$ and the coil current $I_{BOB}$.

In a step 116 of the method, a profile of the speed v of movement of the contactor 1 and a profile of the acceleration α of the contactor 1 are computed by differentiation with respect to time of the values of position x stored in step 114. The profiles of speed v and acceleration α are stored in the electronic control device 40. By extension, the profiles of the speed v and acceleration α of the contactor 1 are also profiles of the speed v and acceleration α of the electromagnetic actuator 30 or of the movable core 34.

The diagnosing method according to the invention makes it possible to precisely determine the profile of the position x of the movable core 34 as a function of time, and profiles of velocity v and acceleration α, which profiles are derived from the profile of the position x. This information may be combined in many ways with a view to monitoring wear of specific components of the contactor 1, for example, the contact pads 29, or indeed the mechanism of the electromagnetic actuator 30.

According to a first example, in a step 118, a travel of the core 34, which travel is equal to the difference between the positions of the core 34 in its stable closed and open position, is evaluated on the basis of the profile of the position x. The travel of the core 34 is then compared to a reference value, which is stored beforehand in the electronic control device 40, so as to detect potential defects of mechanical nature. The reference value of the travel of the core 34 is for example equal to the travel of the core 34 evaluated when the contactor 1 is first installed, i.e., when the contactor 1 is new.

According to another example, a closing time of the electromagnetic actuator 30 is evaluated on the basis of the profile of the position x, which profile is stored in the electronic control device 40, the closing time being equal to a time difference between the time at which, in step 104, the electronic control device 40 commands the electromagnetic actuator 30 to close and the time at which the actuator 30 reaches its stable closed position. The closing time of the actuator 30 is then compared to a reference value, stored beforehand in the electronic control device 40, so as to detect the absence of friction or blockages of mechanical origin. The reference value of the travel of the core 34 is for example a specification of the manufacturer of the contactor 1, or indeed otherwise equal to the closing time measured when the contactor 1 is first installed, i.e. when the contactor 1 is new.

According to yet another example, in a step 120, a minimum speed of compression of the core 34 is measured, the minimum speed of compression being equal to a minimum of the speed v of the core 34 in a terminal segment of the movement of the core 34 in the closing phase. For example, the terminal segment of the movement of the core 34 is located between the position x corresponding to the time at which the contacts 24 and 28 touch and the position in which the actuator 30 is closed and stable.

The minimum speed of compression is then compared to a reference value, stored beforehand in the electronic control device 40.

The minimum speed of compression of the core 34 is an advantageous indicator of the ability of the contactor 1 to close stably. Too low a minimum compression speed is a sign that the magnetic force of the electromagnetic actuator 30 is too low, or indeed that the mechanism is generating too much friction. Thus, if the minimum compression speed of the core 34 is lower than the reference value, the electronic control device 40 sends an alarm signal to an operator.

According to other examples, when the contactor 1 is connected to a multiphase power source, and in particular to a three-phase power source, the position profile x=ƒ(t) is combined with other measurements taken on each of the poles of the contactor 1, and for example with measurements of current that are carried out by means of sensors 46. The wear status of the contact pads 29 associated with each of the poles being a priori different, in a phase P2 of closing the contactor 1, the contact pads 29 do not make electrical contact at the same moment. There is therefore a desynchronization of the poles that is related to the dispersion or to the wear of the parts of the contactor 1.

For example, as described in patent application WO-03/054895-A1, current measurements are carried out for each of the poles of the contactor 1. The appearance of current in each of the poles allows the times of closure of the contacts 24 associated with each pole to be detected. By combining this information with the position profile x=ƒ(t) of the core 34, which is obtained by virtue of the present invention and stored in the electronic control device 40, it is possible to precisely evaluate a position of the contacts 24 when they make contact with the corresponding fixed contacts 28, and to deduce therefrom a difference in compression associated with the contacts of each of the poles of the contactor 1.

A final position $\hat{x}_{end}$ is defined as being a stable position of the core 34 in its closed position. For each contact 24 in question, the compression of this contact is equal to the difference between the final position $\hat{x}_{end}$ and the position of the core 34 at the precise time of closure of the contactor 24 in question.

In the particular example of a contactor 1 comprising three poles, each associated with one phase of a three-phase power source, the contacts 29 associated with each of the poles close successively. On closure of the first movable contacts 24, which are also called the first contacts 24A, no current is yet able to flow.

A position $\hat{x}_{i1}$ is defined as being the position of the core 34 when the first contacts 24A make contact with the corresponding fixed contacts 28. A difference between the position $\hat{x}_{i1}$ and the final position $\hat{x}_{end}$ defines an estimation of the compression of the first contacts 24A. In other words, $Ecr_1 = \hat{x}_{i1} - \hat{x}_{end}$.

On closure of the second movable contacts 24, which are also called the second contacts 24B, a current $i_2$ appears and flows between the first contacts 24A and second contacts 24B. The current $i_2$ is detected by the current sensor 46. The position x of the core 34 at this time, which is called the position $\hat{x}_{i2}$, is therefore the position of the core 34 when the second contacts 24B make contact with the corresponding fixed contacts 28.

A difference between the position $\hat{x}_{i2}$ of the second contacts 24B and the final position $\hat{x}_{end}$ defines an estimation of the compression of the second contacts 24B, which compression is denoted $Ecr_2$. In other words, $Ecr_2 = \hat{x}_{i2} - \hat{x}_{end}$.

On closure of the third movable contacts 24, which are also called the third contacts 24C, a current $i_3$ appears and flows between the three poles of the contactor 1. The position x of the core 34 at this time, which is called the position $\hat{x}_{i3}$, is therefore the position of the core 34 when the third contacts 24B make contact with the corresponding fixed contacts 28.

The difference between the position $\hat{x}_{i3}$ of the third contacts 24C and the final position $\hat{x}_{end}$ defines an estimation of the compression of the third contacts, which compression is denoted $Ecr_3$. In other words $Ecr_3 = \hat{x}_{i3} - \hat{x}_{end}$.

In the case of supply of power to a three-phase electrical load 23 such as a motor, only the compressions $Ecr_2$ and $Ecr_3$ are measured, because only the times of appearance of the currents $i_2$ and $i_3$ are detected. In contrast, the compression $Ecr_1$ of the first contacts 24A cannot be measured because no current appears when the first contacts 24A make contact with the corresponding fixed contacts 28—it is only possible to deduce that the compression $Ecr_1$ of the first contacts 24A is greater than the compression $Ecr_2$ of the second contacts 24B.

According to other examples, by combining the information relative to the times of appearance of the currents on each of the poles with the profile of the speed v of the core 34, which is obtained by virtue of the present invention and stored in the electronic control device 40, it is possible to precisely evaluate a speed of the contacts 24 when they make contact with the corresponding fixed contacts 28, and to deduce therefrom a difference in compression associated with the contacts of each of the poles of the contactor 1.

In the illustrated example, the electronic control device 40 performs both the function of controlling the electromagnetic actuator 30 and the function of implementing the diagnosing method according to the invention.

As a variant (not shown) the diagnosing method is implemented by a specific electronic device, which is added to an existing contactor 1 during a maintenance operation. Such a specific device requires, to implement the diagnosing method according to the invention, only measurements of the coil current $I_{BOB}$ and coil voltage $U_{BOB}$ and optionally measurements of the power currents flowing through the upstream line 20.

According to another variant, when a contactor 1 comprises an electronic control device 40 that is not configured to implement the diagnosing method according to the invention, if sensors of coil current and coil voltage are present, it is possible to configure the electronic control device 40 of the contactor 1 so that it is able to implement the diagnosing method according to the invention, for example by physically replacing the electronic control device 40 or indeed, where appropriate, by changing the computational code of the electronic control device 40.

The embodiments and the variants mentioned above may be combined with one another to create new embodiments of the invention.

The invention claimed is:

1. A method for diagnosing an operating state of a switching apparatus, the switching apparatus being configured to be coupled to an electrical conductor and comprising:
   separable contacts that are associated with the electrical conductor and that are driven by an electromagnetic actuator comprising a coil connected to an electronic control device that is configured to apply a coil command voltage across the terminals of the coil, and
   sensors that are configured to measure a magnitude of a coil current flowing through the coil and the coil voltage,
   the method comprising diagnosing an operating state of the switching apparatus which comprises a contactor, the diagnosing including:
   a) receiving an order to close the switching apparatus, the switching apparatus initially being in an open state, the order to close being received by the electronic control device;
   b) after the order to close has been received, commanding the electromagnetic actuator to close, by means of the electronic control device;
   c) as the switching apparatus switches to the closed state, measuring values of the coil voltage and coil current using the sensors and storing the values of the coil voltage and coil current;
   d) computing and storing values of a magnetic flux passing through the coil based on the stored values of the coil current and coil voltage and on values of the resistance and inductance of the coil that are stored beforehand in the electronic control device; and
   e) on the basis of the stored values of the magnetic flux and coil current, evaluating and storing positions of a core of the electromagnetic actuator depending on a data table characteristic of the electromagnetic actuator, the data table being stored beforehand in the electronic control device and defining a bijective relationship between the position of the core, the magnetic flux and the coil current,
   wherein computing values of the magnetic flux comprises an initial substep, referred to as the self-correction substep, followed by a computing substep, the self-correction substep comprising applying a current to the coil lower than a current referred to as the "start" current, keeping the movable core in the open position by a return member of the electromagnetic actuator, and evaluating and storing an initial value of the magnetic flux, said value being referred to as the "initial flux", so that, when the coil current increases above the start current, the computation of the magnetic flux takes into account the value of the initial flux.

2. The method according to claim 1, wherein, in commanding the electromagnetic actuator to close, the electronic control device commands the electromagnetic actuator to close when the coil current reaches a given percentage of the start current that is 50% or below of the value of the start current so that the self-correction substep lasts long enough for the computation of the initial flux to converge.

3. The method according to claim 1, further comprising computing, from a profile of the position stored in the electronic control device, a closing time of the electromagnetic actuator, the closing time being equal to a time difference between the time at which the electronic control device commands the electromagnetic actuator to close and the time at which the electromagnetic actuator reaches its stable closed position.

4. The method according to claim 1 further comprising computing, by derivation with respect to time of a profile of the position stored in the electronic control device, a profile of the speed of movement of the switching apparatus and a profile of the acceleration of the switching apparatus, and storing the speed and acceleration profiles in the electronic control device.

5. The method according to claim 4, further comprising computing, from the profile of the speed of the switching apparatus, a minimum compression speed of the core, the minimum compression speed being equal to a minimum of the speed of the core in a terminal segment of the movement of the core in a closing phase, the closing phase being an interval over which the switching apparatus switches to the closed state.

6. The method according to claim 4 further comprising detecting precise times of closure of each contact associated with each pole of the switching apparatus by means of current sensors, and combining the profile of the speed stored in the electronic control device, and the precise times of closure of each contact, in order to evaluate a closing speed of each contact.

7. The method according to the claim 6, wherein a compression associated with the movable contacts of each pole is evaluated by combining the profile of the position of the core at the precise times of closure of each contact, the compression of each movable contact being equal to the difference between a final position of the core in its stable closed position and the position of the core at the precise time of closure of the contact in question.

8. The method according to claim 1, wherein the magnetic flux is computed by integration of the stored values of the coil current and coil voltage and of a value of the resistance of the coil that is stored beforehand in the electronic control device, and by using a value related to the inductance of the coil stored beforehand in the electronic control device.

9. The method according to claim 1, wherein the positions are evaluated and stored in relation to time to provide a profile of the position of the core of the electromagnetic actuator as a function of time, and the profile of the position of the core or information derived from the profile is evaluated to monitor wear of the switching apparatus or a component thereof.

10. The method according to claim 1, wherein
a travel of the core of the electromagnetic actuator of the contactor between the open state and the closed state is evaluated on the basis of a profile of the positions of the core; and
the travel of the core of the electromagnetic actuator is compared to a reference value, which is stored beforehand in the electronic control device, so as to detect for a potential defect of a mechanical nature of the contactor.

11. The method according to claim 1, wherein computing values of the magnetic flux compensates for variability of magnetic-gap dimensions of the contactor.

12. The method according to claim 11, wherein computing values of the magnetic flux includes:
compensating an estimated initial magnetic flux to correct for variability of magnetic-gap dimensions of the contactor.

13. An electrical switching apparatus configured to be coupled to an electrical conductor and comprising:
separable contacts that are moved between an open position and a closed position by an electromagnetic actuator comprising a coil and a movable core that is attached to the separable contacts, the switching apparatus having a structure that limits the generation of eddy currents;
a command circuit for controlling the voltage across the terminals of the coil, said voltage being referred to as the "coil voltage", the command circuit comprising a device referred to as the "release" device, which may be selectively activated in order to make drop the electrical current flowing through the coil, which is referred to as the "coil current", the coil voltage and the release device being activated or deactivated depending on the states of the command circuit;
sensors for measuring the coil current and coil voltage; and
an electronic control device that is configured to receive orders to open and close the switching apparatus, to receive the values of the measurements of coil current and coil voltage, and to control the states of the command circuit;
wherein the switching apparatus comprises a contactor and is configured to diagnose an operating state of the switching apparatus, by implementing a diagnosing method comprising:
a) receiving an order to close;
b) commanding the electromagnetic actuator to close;
c) measuring values of the coil voltage and coil current using the sensors and storing the values of the coil voltage and coil current;
d) computing and storing values of a magnetic flux passing through the coil based on the stored values of the coil current and coil voltage and on values, which are stored beforehand in the electronic control device, of the resistance and inductance of the coil; and
e) on the basis of the stored values of the magnetic flux and coil current, evaluating and storing positions of the core depending on a data table characteristic of the electromagnetic actuator, the data table defining a bijective relationship between the position of the core, the magnetic flux and the coil current,
wherein computing values of the magnetic flux comprises an initial substep, referred to as the self-correction substep, followed by a computing substep, the self-correction substep comprising applying a current to the coil lower than a current referred to as the "start" current, keeping the movable core in the open position by a return member of the electromagnetic actuator, and evaluating and storing an initial value of the magnetic flux, said value being referred to as the "initial flux", so that, when the coil current increases above the start current, the computation of the magnetic flux takes into account the value of the initial flux.

14. The electrical switching apparatus according to claim 13,
wherein the switching apparatus comprises current sensors that are configured to measure a magnitude of the electrical current flowing through each of a plurality of phases of the electrical conductor, the switching apparatus being configured to implement a diagnosing method comprising detecting a precise time of closure of the movable contacts associated with each phase, and combining with the precise times of closure of each of the movable contacts the profile of the position of the core or the profile of the speed of the core, in order to evaluate a compression or a closing speed of each of the movable contacts.

15. The electrical switching apparatus according to claim 13, wherein the magnetic flux is computed by integration of the stored values of the coil current and coil voltage and of a value of the resistance of the coil that is stored beforehand in the electronic control device, and by using a value related to the inductance of the coil stored beforehand in the electronic control device.

16. The electrical switching apparatus according to claim 13, wherein the positions are evaluated and stored in relation to time to provide a profile of the position of the core of the electromagnetic actuator as a function of time, and the profile of the position of the core or information derived from the profile is evaluated to monitor wear of the switching apparatus or a component thereof.

17. The electrical switching apparatus according to claim 13, wherein
- a travel of the core of the electromagnetic actuator of the contactor between an open state and a closed state is evaluated on the basis of a profile of the positions of the core; and
- the travel of the core of the electromagnetic actuator is compared to a reference value, which is stored beforehand in the electronic control device, so as to detect for a potential defect of a mechanical nature of the contactor.

18. The electrical switching apparatus according to claim 13, wherein computing values of the magnetic flux compensates for variability of magnetic-gap dimensions of the contactor.

19. The electrical switching apparatus according to claim 18, wherein computing values of the magnetic flux includes:
compensating an estimated initial magnetic flux to correct for variability of magnetic-gap dimensions of the contactor.

* * * * *